(12) United States Patent
Okamura et al.

(10) Patent No.: US 9,684,082 B2
(45) Date of Patent: Jun. 20, 2017

(54) SCINTILLATOR PANEL AND METHOD FOR MANUFACTURING SCINTILLATOR PANEL

(71) Applicant: Toray Industries, Inc., Chuo-ku, Tokyo (JP)

(72) Inventors: Masaki Okamura, Otsu (JP); Yuichiro Iguchi, Otsu (JP); Hideki Kinoshita, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 3 days.

(21) Appl. No.: 14/432,300

(22) PCT Filed: Sep. 18, 2013

(86) PCT No.: PCT/JP2013/075156
§ 371 (c)(1),
(2) Date: Mar. 30, 2015

(87) PCT Pub. No.: WO2014/054422
PCT Pub. Date: Apr. 10, 2014

(65) Prior Publication Data
US 2015/0241569 A1      Aug. 27, 2015

(30) Foreign Application Priority Data
Oct. 3, 2012      (JP) .................................. 2012-221019

(51) Int. Cl.
*G01T 1/20*      (2006.01)
*H01L 27/146*      (2006.01)
(Continued)

(52) U.S. Cl.
CPC ............ *G01T 1/2002* (2013.01); *G01T 1/202* (2013.01); *G01T 1/2018* (2013.01);
(Continued)

(58) Field of Classification Search
CPC ..... G01T 1/2018; G01T 1/2002; G01T 1/202; H01L 27/14663
See application file for complete search history.

(56) References Cited

U.S. PATENT DOCUMENTS

| | | | | |
|---|---|---|---|---|
| 6,043,604 | A | * | 3/2000 | Horiuchi .................. C03C 8/14 313/292 |
| 2010/0127180 | A1 | * | 5/2010 | Lifshitz ............. H01L 27/14663 250/367 |
| 2014/0091235 | A1 | | 4/2014 | Iguchi |

FOREIGN PATENT DOCUMENTS

| JP | 55067700 | 5/1980 |
|---|---|---|
| JP | 0560871 | 3/1993 |

(Continued)

OTHER PUBLICATIONS

Machine translation to English of JP 2011-021924A.*
International Search Report for International Application No. PCT/JP2013/075156 mailed Nov. 19, 2013.

*Primary Examiner* — David Porta
*Assistant Examiner* — Mindy Vu
(74) *Attorney, Agent, or Firm* — RatnerPrestia

(57) ABSTRACT

The present invention provides a scintillator panel including: a plate-like substrate; a barrier rib provided on the substrate; and a scintillator layer including a phosphor filled in cells divided by the barrier rib, wherein the barrier rib is formed of a material which is mainly composed of a low-melting-point glass containing 2 to 20% by mass of an alkali metal oxide, a value obtained by dividing a top width Lt of the barrier rib or a 90%-height width L90 of the barrier rib by a half-value width Lh of the barrier rib is 0.45 to 1, and a value obtained by dividing a bottom width Lb of the barrier rib or a 10%-height width L10 of the barrier rib by the half-value width Lh is 1 to 3.

6 Claims, 4 Drawing Sheets

(51) Int. Cl.
  *G01T 1/202* (2006.01)
  *G21K 4/00* (2006.01)
  *C09K 11/77* (2006.01)
  *G03F 7/40* (2006.01)
  *C03C 3/066* (2006.01)
  *C03C 8/04* (2006.01)

(52) U.S. Cl.
  CPC ........ *H01L 27/14663* (2013.01); *C03C 3/066* (2013.01); *C03C 8/04* (2013.01); *C09K 11/7701* (2013.01); *G03F 7/40* (2013.01); *G21K 4/00* (2013.01); *G21K 2004/08* (2013.01)

(56) References Cited

FOREIGN PATENT DOCUMENTS

| | | |
|---|---|---|
| JP | 05188148 | 7/1993 |
| JP | 2011007552 | 1/2011 |
| JP | 2011021924 | 2/2011 |
| JP | 2012002627 | 1/2012 |
| JP | 2012058170 | 3/2012 |
| WO | 2011111551 | 9/2011 |
| WO | WO2012/037148 A1 * | 3/2012 |
| WO | 2012161304 | 11/2012 |

* cited by examiner

SCINTILLATOR PANEL AND METHOD FOR MANUFACTURING SCINTILLATOR PANEL

CROSS REFERENCE TO RELATED APPLICATIONS

This application is the U.S. National Phase application of PCT International Application No. PCT/JP2013/075156, filed Sep. 18, 2013, and claims priority to Japanese Patent Application No. 2012-221019, filed Oct. 3, 2012, the disclosures of each of these applications being incorporated herein by reference in their entireties for all purposes.

FIELD OF THE INVENTION

The present invention relates to a scintillator panel which constitutes a radiation detector that is used for a medical diagnostic apparatus, a nondestructive inspection instrument and the like.

BACKGROUND OF THE INVENTION

X-ray images using films have been widely used heretofore in medical settings. However, the X-ray image using a film provides analog image information, and in recent years, digital radiation detectors such as computed radiography (CR) and flat panel radiation detectors (flat panel detectors: FPDs) have been developed.

In a flat panel X-ray detector (FPD), a scintillator panel is used for converting a radiation into visible light. The scintillator panel contains an X-ray phosphor such as cesium iodide (CsI), the X-ray phosphor emits visible light in response to an applied X-ray, and the emitted light is converted into an electric signal by a TFT (thin film transistor) or a CCD (charge-coupled device) to thereby convert X-ray information into digital image information. However, the FPD has a problem of low S/N ratio. This is attributable to scattering of visible light by the X-ray phosphor itself when the X-ray phosphor emits light, etc. For reducing influences of the scattering of light, methods of filling an X-ray phosphor in cells divided by a barrier rib have been proposed (Patent Documents 1 to 4).

The shape of the barrier rib varies depending on a pitch, but the width is approximately 5 to 40 µm, and the height is approximately 100 to 800 µm.

The method which has been heretofore used as a method for forming the barrier rib is a method of etching a silicon wafer, or a method in which a glass paste, a mixture of a pigment or a ceramic powder and a low-melting-point glass powder, is pattern-printed in multiple layers using a screen printing method, and then fired to form a barrier rib. However, in the method of etching a silicon wafer, the size of a scintillator panel that can be formed is restricted by the size of a silicon wafer, and a scintillator panel having a large size of, for example, 500 mm square cannot be obtained. A plurality of small-size panels should be arranged for making a large-size panel, but production of a scintillator panel in this way is difficult in terms of accuracy, and it is difficult to prepare a large-area scintillator panel.

In the multi-layer screen printing method using a glass paste, processing of high accuracy is difficult due to a dimensional variation of a screen printing plate, etc. Further, when multi-layer screen printing is performed, a definite barrier rib width is required for enhancing the strength of a barrier rib in order to prevent destructive defects of the barrier rib. However, if the width of the barrier rib increases, a space between barrier ribs becomes relatively small, so that a volume available for filling an X-ray phosphor decreases, and the filling amount is not uniform. Therefore, a scintillator panel obtained in this method has the disadvantage that the amount of an X-ray phosphor is so small that the luminescence is reduced, and luminous unevenness occurs. This disadvantage makes it difficult to photograph sharp images in photographing in a low radiation dose.

That is, for preparing a scintillator panel which has high luminous efficiency and provides sharp images, a technique for processing a barrier rib, which is capable of processing the barrier rib with high accuracy over a large area and narrowing the width of the barrier rib, and a technique for preventing visible light, which is emitted by an X-ray phosphor, from being leaked to outside are required.

PATENT DOCUMENTS

Patent Document 1: Japanese Patent Laid-open Publication No. 5-60871
Patent Document 2: Japanese Patent Laid-open Publication No. 5-188148
Patent Document 3: Japanese Patent Laid-open Publication No. 2011-007552
Patent Document 4: Japanese Patent Laid-open Publication No. 2011-021924

SUMMARY OF THE INVENTION

An object of the present invention is to solve the above-described disadvantages and provide a scintillator panel which is provided with a narrow barrier rib with high accuracy in a large area, has high luminous efficiency, and provides sharp images.

The above-described object is achieved by any of the following technical means.

(1) A scintillator panel including: a plate-like substrate; a barrier rib provided on the substrate; and a scintillator layer including a phosphor filled in cells divided by the barrier rib, wherein the barrier rib is formed of a material which is mainly composed of a low-melting-point glass containing 2 to 20% by mass of an alkali metal oxide, a value obtained by dividing a top width Lt of the barrier rib or a 90%-height width L90 of the barrier rib by a half-value width Lh of the barrier rib is 0.45 to 1, and a value obtained by dividing a bottom width Lb of the barrier rib or a 10%-height width L10 of the barrier rib by the half-value width Lh is 1 to 3.
(2) The scintillator panel according to (1), wherein a pitch P of the barrier rib is 50 to 120 µm, the half-value width Lh is 5 to 30 µm, and a height H of the barrier rib is 100 to 500 µm.
(3) The scintillator panel according to (1), wherein the pitch P of the barrier rib is 120 to 240 µm, the half-value width Lh is 10 to 40 µm, and the height H of the barrier rib is 200 to 800 µm.
(4) The scintillator panel according to any one of (1) to (3), wherein a line that connects the end of the central portion of the barrier rib to the bottom surface of the barrier rib at a cross section perpendicular to the longitudinal direction in the barrier rib is a curved line.
(5) The scintillator panel according to any one of (1) to (4), wherein a reflecting film is formed on a surface of the barrier rib.
(6) A method for manufacturing the scintillator panel according to any one of (1) to (5), the method including: a step of forming a photosensitive paste coating film by applying onto a substrate a photosensitive paste which contains a low-melting-point glass and a photosensitive organic component; an exposure step of exposing the obtained photosensitive paste coating film to light in a predetermined pattern; a development step of dissolving and removing a part of the exposed photosensitive paste coating film which is soluble in a developer; a firing step of heating the photosensitive paste coating film pattern after development to a firing temperature of 500° C. to 700° C. to remove the organic component and soften and sinter the low-melting-point glass and thereby forming a barrier rib; and a step of filling a phosphor.

According to the present invention, a barrier rib having a high strength can be formed with high accuracy in a large area, and visible light emitted by a phosphor can be efficiently utilized, so that there can be provided a scintillator panel which has a large size and provides sharp images, and a method for manufacturing the scintillator panel.

DETAILED DESCRIPTION OF EMBODIMENTS OF THE INVENTION

The preferred configurations of a scintillator panel of the present invention and a radiation detector using the scintillator panel will be described below with reference to the drawings, but the present invention is not limited thereto.

Figure 7:
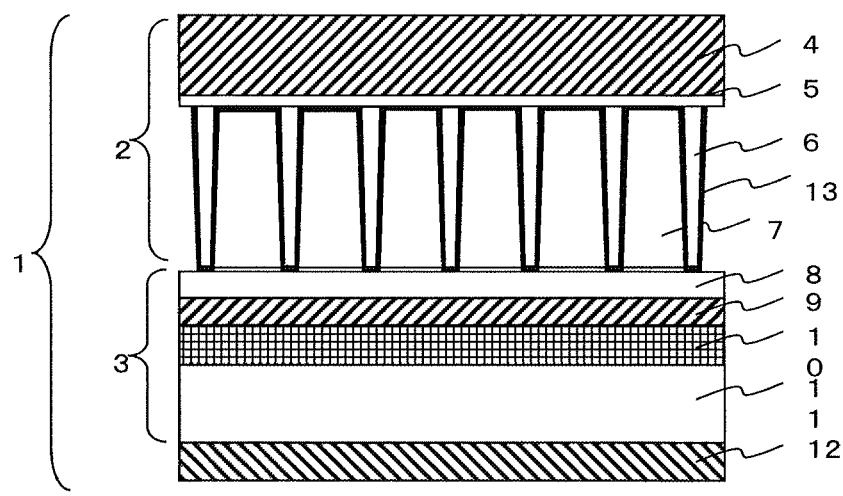
FIG. 7 is a sectional view schematically showing the configuration of a radiation detector including a scintillator panel of an aspect of the present invention.
Figure 8:
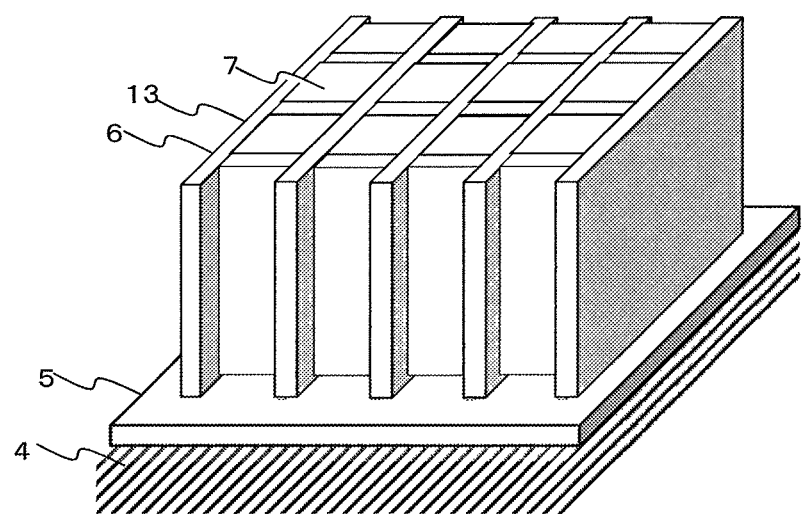
FIG. 8 is a perspective view schematically showing the configuration of the scintillator panel of an aspect of the present invention.

FIG. 7 is a sectional view schematically showing the configuration of an embodiment of a radiation detector including a scintillator panel of the present invention. FIG. 8 is a perspective view schematically showing the configuration of an embodiment of the scintillator panel of the present invention. A radiation detector 1 includes a scintillator panel 2, an output substrate 3 and a power supply portion 12. The scintillator panel 2 includes a scintillator layer 7 including a phosphor, and absorbs energy of an incident radiation such as an X-ray to emit an electromagnetic wave having a wavelength ranging from 300 to 800 nm, i.e. an electromagnetic wave (light) which ranges from ultraviolet light to infrared light with visible light at the center.

The scintillator panel 2 includes a substrate 4, a grid-like barrier rib 6 formed on the substrate and intended for dividing cells, and a scintillator layer 7 including a phosphor filled in a cell formed by the barrier rib. By further forming a buffer layer 5 between the substrate 4 and the barrier rib 6, the barrier rib 6 can be stably formed. It is preferable that a reflecting film 13 is formed on the barrier rib 6 and the substrate 4. Owing to the reflecting film 13, visible light emitted by the phosphor can be reflected without passing through the barrier rib 6, and resultantly light emitted at the scintillator layer 7 can be made to reach a photoelectric conversion layer 9 on the output substrate 3 efficiently.

The output substrate 3 has the photoelectric conversion layer 9 in which pixels including photosensors and TFT are two-dimensionally formed, and an output layer 10 on a substrate 11. When the light exit surface of the scintillator panel 2 and the photoelectric conversion layer 9 of the output substrate 3 are bonded or adhered to each other with a diaphragm layer 8, which contains a polyimide resin or the like, interposed therebetween, the radiation detector 1 is formed. Light emitted at the scintillator layer 7 reaches the photoelectric conversion layer 9, undergoes photoelectric conversion at the photoelectric conversion layer 9, and generates output. In the scintillator panel of embodiments of the present invention, each cell is divided by a barrier rib, and therefore when the size and pitch of pixels of a photoelectric conversion element arranged in a grid-like shape are made coincident with the size and pitch of cells of the scintillator panel, scattered light can be prevented from reaching a neighboring cell even though light is scattered by a phosphor. In this way, blurring of images resulting from light scattering can be reduced, so that high-accuracy photographing is possible.

Figure 1:
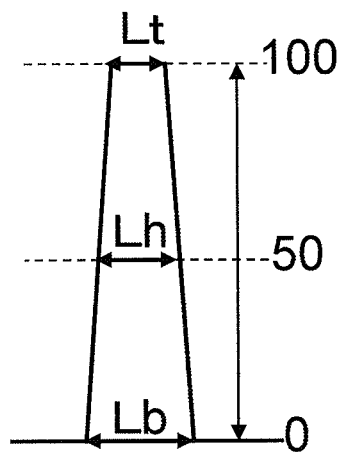
FIG. 1 is a schematic view showing a cross section perpendicular to the longitudinal direction in a barrier rib of a first aspect in the present invention.

The barrier rib that forms the scintillator panel of the present invention preferably satisfies the following requirement: a value obtained by dividing Lt by Lh is 0.45 to 1 and a value obtained by dividing Lb by Lh is 1 to 3 where Lt is a top width of the barrier rib, Lh is a half-value width of the barrier rib, and Lb is a bottom width of the barrier rib. For securing the strength of the phosphor filling space and the barrier rib, the value obtained by dividing Lt by Lh is preferably 0.6 to 1, more preferably 0.8 to 1, further preferably 0.8 to 0.95. The value obtained by dividing Lb by Lh is preferably 1 to 2, more preferably 1 to 1.5, further preferably 1.3 to 1.5. Lt, Lh and Lb in the barrier rib of the first aspect are shown in FIG. 1. Here, Lh refers to a line width of a portion at a height of 50 from the bottom surface of the barrier rib where the height of the barrier rib is 100 (hereinafter, referred to as "barrier rib central portion") at a cross section perpendicular to the longitudinal direction in the barrier rib.

If Lt/Lh is more than 1, constriction occurs at the periphery of the central portion of the barrier rib, so that filling amount of the phosphor to the pitch of the barrier rib decreases, and an opening for extracting light emitted by the phosphor is narrowed, leading to a decrease in luminance. Besides, nonuniformity such as coating unevenness and thickness unevenness occurs at the time of filling the phosphor. On the other hand, if Lt/Lh is less than 0.45, the top of the barrier rib becomes extremely narrow, causing a shortage of strength for sustaining a pressure applied at the time of bonding the scintillator panel to a light detection substrate, so that the top of the barrier rib may be easily collapsed, or the barrier rib may be cut at some midpoint, leading to occurrence of breakage.

If Lb/Lh is less than 1, the strength of the barrier rib decreases, so that falling, breakage or torsion of the barrier rib occurs. On the other hand, if Lb/Lh is more than 3, the filling amount of the phosphor decreases, so that the luminance decreases.

The shape of the barrier rib described above can be controlled by changing various conditions described later.

Figure 2:
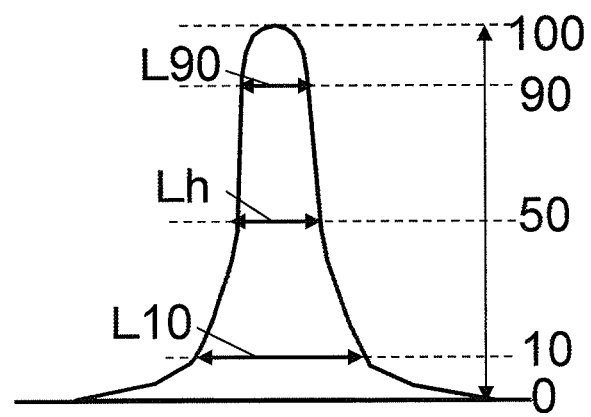
FIG. 2 is a schematic view showing a cross section perpendicular to the longitudinal direction in a barrier rib of a second aspect in the present invention.

When the top of the barrier rib is rounded, or the bottom of the barrier rib is trailed, so that it is difficult to exactly perceive the top of the barrier rib or the bottom of the barrier rib, a 90%-height width (L90) in place of Lt or a 10%-height width (L10) in place of Lb can be used. In this case, it is preferred that a value obtained by dividing L90 by Lh be 0.45 to 1, and a value obtained by dividing L10 by Lh be 1 to 3. The value obtained by dividing L90 by Lh is preferably 0.8 to 1, and the value obtained by dividing L10 by Lh is preferably 1 to 1.5. L90, Lh and L10 in the barrier rib of the second aspect are shown in FIG. 2. Here, L90 refers to a line width of a portion at a height of 90 from the bottom surface of the barrier rib where the height of the barrier rib is 100 at a cross section perpendicular to the longitudinal direction in the barrier rib. Here, L10 refers to a line width of a portion at a height of 10 from the bottom surface of the barrier rib where the height of the barrier rib is 100 at a cross section perpendicular to the longitudinal direction in the barrier rib.

Various kinds of line widths of the barrier rib, such as Lt, Lb, L90, L10 and Lh, can be each calculated by repeatedly measuring 25 random spots on the formed barrier rib with a scanning electron microscope (for example, "S-4800" manufactured by Hitachi, Ltd.), and determining an average thereof.

More specifically, the measurement with a scanning electron microscope can be made in the following manner. First, the barrier rib is cut at right angles to the stripe direction of the barrier rib, i.e. the longitudinal direction, so that the cross section of the barrier rib is as shown in FIG. 1 etc., and the cross section is processed to a size available for observation with a scanning electron microscope. As a measurement magnification, a magnification is selected so that the visual field includes 2 to 5 barrier ribs. For example, when the pitch of the barrier rib is 160 μm, a magnification of 200 to 300 may be selected. Thereafter, the reduced scale can be calibrated with a standard sample having a size comparable to the line width of the barrier rib, followed by taking a picture, and calculating a line width from the reduced scale.

Figure 4:
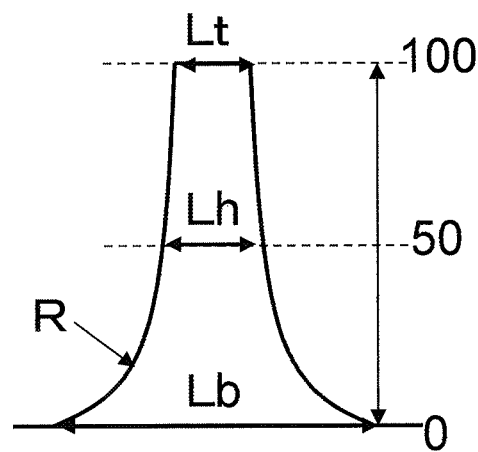
FIG. 4 is a schematic view showing a cross section perpendicular to the longitudinal direction in a barrier rib of a fourth aspect in the present invention.

The line S that connects the end of the central portion of the barrier rib to the end of the bottom surface of the barrier rib at a cross section perpendicular to the longitudinal direction in the barrier rib is not limited to a straight line as shown in FIG. 1, and may be a curved line having a curvature radius R as shown in FIG. 4. The line S is preferably a curved line because even when the value obtained by dividing Lb by Lh increases, a wide phosphor filling space can be secured, so that the luminance does not decrease. The curvature radius R of the line S is preferably Lh or greater.

Lh is preferably 5 to 40 μm. If Lh is more than 40 μm, the opening ratio decreases, so that a sufficient luminance is not obtained. On the other hand, if Lh is less than 5 μm, the barrier rib has an insufficient strength, resulting in occurrence of falling or torsion of the barrier rib.

For providing definite and sharp images, the pitch of the barrier rib is preferably 30 to 300 μm, more preferably 50 to 240 μm.

The height of the barrier rib is preferably 50 to 3000 μm, more preferably 100 to 800 μm. If the height of the barrier rib is less than 50 μm, sufficient luminance is not obtained. On the other hand, if the height of the barrier rib is more than 3000 μm, luminous efficiency decreases.

For observing a more definite X-ray image with a low exposure amount, it is preferable that where P is the pitch of the barrier rib and H is the height of the barrier rib, the barrier rib has a shape in which Lh is 5 to 30 μm and H is 100 to 500 μm when P is 50 to 120 μm. Preferably, Lh is 10 to 40 μm and H is 200 to 800 μm when P is 120 to 240 μm.

The material of the substrate to be used for the scintillator panel of the present invention is preferably a material pervious to radiations, and various kinds of glasses, polymer materials, metals and the like can be used. For example, a glass plate containing a glass such as quartz, borosilicate glass or chemically reinforced glass; a ceramic substrate containing a ceramic such as sapphire, silicon nitride, silicon carbide; a semiconductor substrate containing a semiconductor such as silicon, germanium, gallium arsenide, gallium phosphide or gallium nitrogen; a polymer film (plastic film) such as a cellulose acetate film, a polyester film, a polyethylene terephthalate film, a polyamide film, a polyimide film, a triacetate film, a polycarbonate film or a carbon fiber reinforced resin sheet; a metal sheet such as an aluminum Sheet, an iron sheet or a copper sheet; a metal sheet having a coating layer of a metal oxide, or an amorphous carbon substrate; or the like can be used. Particularly, a glass plate is preferable in terms of flatness and heat resistance. Further, since weight reduction of the scintillator panel is promoted for pursuing convenience of transportation of the scintillator panel, the glass plate is preferably a thin glass.

A barrier rib is formed on the substrate. The barrier rib is preferably formed of a material which is mainly composed of a low-melting-point glass containing 2 to 20% by mass of an alkali metal oxide in terms of durability, heat resistance and high-definition processing. The material which is mainly composed of a low-melting-point glass containing 2 to 20% by mass of an alkali metal oxide has a proper refractive index and a softening temperature, and is suitable for forming a narrow barrier rib in a large area and with high accuracy. The low-melting-point glass refers to a glass having a softening temperature of 700° C. or lower. The phrase "mainly composed of a low-melting-point glass containing 2 to 20% by mass of an alkali metal oxide" means that a low-melting-point glass containing 2 to 20% by mass of an alkali metal oxide constitutes 50 to 100% by mass of a material that forms the barrier rib.

A method for manufacturing the scintillator panel of the present invention preferably includes: a step of forming a photosensitive paste coating film by applying onto a substrate a photosensitive paste which contains a low-melting-point glass and a photosensitive organic component; an exposure step of exposing the obtained photosensitive paste coating film to light in a predetermined pattern; a development step of dissolving and removing a part of the exposed photosensitive paste coating film which is soluble in a developer; a firing step of heating the photosensitive paste coating film pattern after development to a firing temperature of 500 to 700° C. to remove the organic component and soften and sinter the low-melting-point glass and thereby forming a barrier rib; forming a metallic reflecting film at a temperature lower than the firing temperature using a vacuum film formation method; and a step of filling a phosphor.

In the exposure step, a necessary part of the photosensitive paste coating film is photocured, or an unnecessary part of the photosensitive paste coating film is photodecomposed by exposure to add a contrast of dissolution of the photosensitive paste coating film in a developer. In the development step, an unnecessary part of the exposed photosensitive paste coating film is removed with a developer, so that a photosensitive paste coating film pattern in which only a necessary part of the coating film remains is obtained.

In the firing step, the obtained photosensitive paste coating film pattern is fired at a temperature of 500 to 700° C., preferably 500 to 650° C., whereby the organic component is decomposed and distilled away, and the low-melting-point glass is softened and sintered to form a barrier rib containing a low-melting-point glass. For completely removing the organic component, the firing temperature is preferably 500° C. or higher. If the firing temperature is higher than 700° C., deformation of the substrate increases when a general glass substrate is used as the substrate, and therefore the firing temperature is preferably 700° C. or lower.

The method of the present invention is capable of processing with high accuracy as compared to a processing method in which a glass paste is printed by laminating by a multi-layer screen printing and then fired.

The photosensitive paste for use in the present invention is preferably formed of an organic component containing a photosensitive organic component, and an inorganic powder containing a low-melting-point glass containing 2 to 20% by mass of an alkali metal oxide. The organic component is preferred in a definite amount for forming a photosensitive paste coating film pattern before firing, but if the amount of the organic component is excessively large, the amount of substances removed in the firing step increases, so that the shrinkage rate after firing becomes large, and therefore pattern defects easily occur in the firing step. On the other hand, an excessively small amount of the organic component may not be preferable because miscibility and dispersibility of an inorganic powder in the paste are deteriorated, so that not only defects easily occur during firing, but also coatability of the paste is deteriorated due to an increase in viscosity of the paste, and further the stability of the paste is adversely affected. Thus, the content of the inorganic powder in the photosensitive paste is preferably 30 to 80% by mass, more preferably 40 to 70% by mass. The content of the inorganic powder being less than 30% by mass is not preferable because the shrinkage rate during firing increases to cause breakage and peeling of the barrier rib. Further, pattern thickening and remaining of a film during development easily occur, and Lb/Lh easily becomes greater than 3. Therefore the content of less than 30% by mass is not preferable. On the other hand, if the content of the inorganic powder is more than 80% by mass, the amount of the photosensitive organic component decreases, so that the photosensitive paste coating film is not photocured to the bottom in the exposure step. As a result, Lt/Lh easily becomes greater than 1, and Lb/Lh easily becomes smaller than 1. Therefore, the content of more than 80% by mass is not preferable.

The content of the low-melting-point glass is preferably 50 to 100% by mass based on the total of the inorganic powder. The content of the low-melting-point glass being less than 50% by mass with respect to the inorganic powder is not preferable because sintering does not properly proceed in the firing step, and therefore the strength of the barrier rib obtained decreases.

For ensuring that in the firing step, the organic component is almost completely removed and the barrier rib obtained has a definite strength, it is preferable to use a low-melting-point glass containing a low-melting-point glass having a softening temperature of 480° C. or higher. If the softening temperature is lower than 480° C., the low-melting-point glass is softened before the organic component is sufficiently removed during firing, so that residues of the organic component are captured in the glass. In this case, the organic component may be gradually released later to deteriorate product quality. Further, residues of the organic component captured in the glass become a cause of coloring of the glass. When a low-melting-point glass powder having a softening temperature of 480° C. or higher is used and firing is performed at 500° C. or higher, the organic component can be completely removed. As described above, it is preferred that the firing temperature be 500 to 700° C. Since the firing temperature is preferably 500 to 650° C., the softening temperature of the low-melting-point glass is preferably 480 to 680° C., more preferably 480 to 620° C.

The softening temperature is determined by extrapolating a heat absorption completion temperature at an endothermic peak by a tangent method from a DTA curve obtained by measuring a sample using a differential thermal analyzer (DTA, "Differential Type Differential Thermal Balance TG8120" manufactured by Rigaku Corporation). Specifically, an inorganic powder as a measurement sample is measured by elevating the temperature at 20° C./minute from room temperature with an alumina powder as a standard sample using a differential thermal analyzer, thereby obtaining a DTA curve. A softening point Ts determined by extrapolating a heat absorption completion temperature at an endothermic peak by a tangent method from the obtained DTA curve is defined as a softening temperature.

For obtaining a low-melting-point glass, a metal oxide selected from the group consisting of lead oxide, bismuth oxide, zinc oxide and alkali metal oxides, which are materials effective for lowering the melting point of glass, can be used. Particularly, it is preferable to adjust the softening temperature of glass using an alkali metal oxide. Generally the alkali metal refers to lithium, sodium, potassium, rubidium and cesium, but the alkali metal oxide for use in the present invention refers to a metal oxide selected from the group consisting of lithium oxide, sodium oxide and potassium oxide.

In the present invention, it is preferred that the content X of an alkali metal oxide ($M_2O$) in the low-melting-point glass be in a range of 2 to 20% by mass. If the content of the alkali metal oxide is less than 2% by mass, the softening temperature becomes high, and therefore it is preferred to perform the firing step at a high temperature. Accordingly, when a glass substrate is used as the substrate, it is likely that the scintillator panel obtained is distorted or defects occur in the barrier rib due to deformation of the substrate in the firing step, and therefore the content of less than 2% by mass is not suitable. If the content of the alkali metal oxide is more than 20% by mass, the viscosity of glass decreases too much in the firing step. Accordingly, the shape of the barrier rib obtained is easily distorted. Further, the porosity of the barrier rib obtained becomes excessively small, leading to a decrease in light emission luminance of the scintillator panel obtained.

Further, it is preferable to add 3 to 10% by mass of zinc oxide in addition to the alkali metal oxide for adjusting the viscosity of glass at a high temperature. If the content of zinc oxide is less than 3% by mass, the viscosity of glass at a high temperature becomes high, and addition of zinc oxide in an amount of more than 10% by mass tends to increase the cost of glass.

Further, by including, in addition to the alkali metal oxide and zinc oxide, silicon oxide, boron oxide, aluminum oxide, an oxide of an alkali earth metal or the like in the low-melting-point glass, the stability, crystallinity, transparency, refractive index, thermal expansion characteristic or the like of the low-melting-point glass can be controlled. As a composition of the low-melting-point glass, the composition range shown below is preferable because a low-melting-point glass having a viscosity characteristic suitable for the present invention can be prepared.

Alkali metal oxide: 2 to 20% by mass
Zinc oxide: 3 to 10% by mass
Silicon oxide: 20 to 40% by mass
Boron oxide: 25 to 40% by mass
Aluminum oxide: 10 to 30% by mass
Alkali earth metal oxide: 5 to 15% by mass The alkali earth metal refers to one or more metal selected from the group consisting of magnesium, calcium, barium and strontium.

The particle diameter of inorganic particles containing a low-melting-point glass can be evaluated using a particle size distribution analyzer ("MT 3300" manufactured by NIKKISO CO., LTD.). As a measurement method, an inorganic powder is charged in a sample chamber filled with water, and subjected to an ultrasonic treatment for 300 seconds, followed by performing a measurement.

The 50% volume average particle diameter (D50) of the low-melting-point glass is preferably 1.0 to 4.0 μm. If D50 is less than 1.0 μm, agglomeration of particles becomes strong, so that it becomes difficult to achieve uniform dispersibility, leading to unstable fluidity of a paste. In this case, thickness uniformity when a paste is applied is deteriorated. If D50 is more than 4.0 μm, the surface unevenness of a sintered body obtained increases, so that a pattern tends to be broken in a subsequent step.

The photosensitive paste for use in the present invention may contain as a filler a high-melting-point glass that is not softened at 700° C., or ceramic particles such as those of silicon oxide, aluminum oxide, titanium oxide or zirconium oxide in addition to the above-described low-melting-point glass. The filler, when used together with the low-melting-point glass, has an effect of controlling the shrinkage rate after firing of a paste composition and retaining the shape of the barrier rib formed. However, if the ratio of the filler to the total of the inorganic powder is more than 50% by mass, sintering of the low-melting-point glass is hindered to cause a problem such as a reduction in strength of the barrier rib, and therefore the ratio of more than 50% by mass is not preferable. Preferably the filler has an average particle diameter of 0.5 to 4.0 μm for the same reason as that described for the low-melting-point glass.

In the photosensitive paste for use in the present invention, the average refractive index n1 of the low-melting-point glass and the average refractive index n2 of the photosensitive organic component satisfy preferably $-0.1<n1-n2<0.1$, more preferably $-0.01 \leq n1-n2 \leq 0.01$, further preferably $-0.005 \leq n1-n2 \leq 0.005$. By satisfying the above-described average refractive index n1, light scattering at the interface between the low-melting-point glass and the photosensitive organic component is suppressed in the exposure step, so that pattern formation can be performed with high accuracy. On the other hand, if $n1-n2<-0.01$ or $n1-n2>0.01$, light scattering easily occurs at the interface between the low-melting-point glass and the photosensitive organic component in the exposure step. As a result, if the exposure amount is small in the exposure step, light does not reach the bottom of the photosensitive paste coating film, and therefore Lt/Lh easily becomes greater than 1 and Lb/Lh easily becomes smaller than 1. Therefore, the relationship of $n1-n2<-0.01$ or $n1-n2>0.01$ is not preferable. However, increasing the exposure amount is not preferable because the photosensitive paste coating film is cured by scattered light due to increased light scattering, so that Lt/Lh easily becomes smaller than 0.45 and Lb/Lh easily becomes greater than 3.

By adjusting the compounding ratio of oxides that constitute the low-melting-point glass, a low-melting-point glass having both a preferable heat characteristic and a preferable average refractive index can be obtained.

The refractive index of the low-melting-point glass can be measured using a Becke line detection method. A refractive index at 25° C. and at a wavelength of 436 nm (g-line) was defined as the refractive index of the low-melting-point glass in the present invention. The average refractive index of the photosensitive organic component can be determined by measuring a coating film composed of a photosensitive organic component by ellipsometry. A refractive index at 25° C. and at a wavelength of 436 nm (g-line) was defined as the average refractive index of the photosensitive organic component.

When the photosensitive paste for use in the present invention includes a photosensitive organic component as an organic component, it can be pattern-processed by the photosensitive paste method described above. By using a photosensitive monomer, a photosensitive oligomer, a photosensitive polymer, a photo-polymerization initiator or the like as the photosensitive organic component, reactivity can be controlled. Here, the photosensitivity in the photosensitive monomer, the photosensitive oligomer and the photosensitive polymer means that when the paste is irradiated with active light rays, the photosensitive monomer, the photosensitive oligomer or the photosensitive polymer undergoes a reaction of photo-crosslinking, photo-polymerization or the like to change the chemical structure.

The photosensitive monomer is a compound having an active carbon-carbon double bond, and examples thereof include monofunctional compounds and polyfunctional compounds having a vinyl group, an acryloyl group, a methacryloyl group or an acrylamide group as a functional group. Particularly, it is preferable that the photosensitive organic component contains 10 to 80% by mass of a compound selected from the group consisting of polyfunctional acrylate compounds and polyfunctional methacrylate compounds from the viewpoint of increasing the crosslinking density during curing by a photoreaction to improve pattern formability. As the polyfunctional acrylate compounds and polyfunctional methacrylate compounds, a variety of kinds of compounds have been developed, and an appropriate one can be selected from those compounds in consideration of reactivity, a refractive index and the like.

As the photosensitive oligomer or the photosensitive polymer, an oligomer or polymer having an active carbon-carbon unsaturated double bond is preferably used. The photosensitive oligomer or the photosensitive polymer is obtained by, for example, copolymerizing a carboxyl group-containing monomer such as acrylic acid, methacrylic acid, itaconic acid, crotonic acid, maleic acid, fumaric acid, vinylacetic acid or an acid anhydride thereof, and a monomer such as a methacrylic acid ester, an acrylic acid ester, styrene, acrylonitrile, vinyl acetate or 2-hydroxy acrylate. As a method for introducing an active carbon-carbon unsaturated double bond into an oligomer or a polymer, a method can be used in which an ethylenically unsaturated compound having a glycidyl group or an isocyanate group, acrylic acid chloride, methacrylic acid chloride or acryl chloride, or a carboxylic acid such as maleic acid is reacted with a mercapto group, an amino group, a hydroxyl group or a carboxyl group in an oligomer or a polymer, etc.

By using as the photosensitive monomer or the photosensitive oligomer a monomer or oligomer having a urethane bond, a photosensitive paste insusceptible to pattern defects in the firing step can be obtained. In the present invention, pattern defects can be suppressed because rapid shrinkage is hard to occur in the process of sintering of a glass in the later stage of the firing step due to use of a low-melting-point glass as the glass. In addition, when a compound having a urethane structure is used for the organic component, stress is relaxed in the process of decomposition and distillation of the organic component in the early stage of the firing step, so that pattern defects are hard to occur. Owing to both the effects described above, pattern defects can be suppressed over a wide temperature range.

The photo-polymerization initiator is a compound which generates radicals when irradiated with an active light ray. Specific examples thereof include benzophenone, methyl o-benzoylbenzoate, 4,4-bis(dimethylamino)benzophenone, 4,4-bis(diethylamino)benzophenone, 4,4-dichlorobenzophenone, 4-benzoyl-4-methyl diphenyl ketone, dibenzyl ketone, fluorenone, 2,2-dimethoxy-2-phenylacetophenone, 2-hydroxy-2-methylpropiophenone, thioxanthone, 2-methylthioxanthone, 2-chlorothioxanthone, 2-isopropylthioxanthone, diethylthioxanthone, benzyl, benzyl methoxyethyl acetal, benzoin, benzoin methyl ether, benzoin butyl ether, anthraquinone, 2-t-butylanthraquinone, anthrone, benzanthrone, dibenzosuberone, methylene anthrone, 4-azidobenzalacetophenone, 2,6-bis(p-azidobenzylidene)cyclohexanone, 2,6-bis(p-azidobenzylidene)-4-methylcyclohexanone, 1-phenyl-1,2-butadione-2-(O-methoxycarbonyl)oxime, 1-phenyl-1,2-propanedione-2-(O-ethoxycarbonyl)oxime, 1,3-diphenylpropanetrione-2-(O-ethoxycarbonyl)oxime, 1-phenyl-3-ethoxypropanetrione-2-(O-benzoyl)oxime, Michler ketone, 2-methyl-1-[4-(methylthio)phenyl]-2-morpholino-1-propanone, 2-benzyl-2-dimethylamino-1-(4-morpholinophenyl)butanone-1, naphthalenesulfonyl chloride, quinolinesulfonyl chloride, N-phenylthioacridone, benzothiazole disulfide, triphenylphosphine, benzoin peroxide and eosine, and combinations of a photo-reductive pigments such as methylene blue and reducing agents such as ascorbic acid and triethanolamine. These compounds may be used in combination of two or more thereof.

The content of the photo-polymerization initiator is not limited, but is preferably in a range of 0.05 to 30% by mass, more preferably 0.1 to 20% by mass with respect to the photosensitive component. If the amount of the photo-polymerization initiator decreases, the photosensitivity decreases, and the barrier rib is thinned. If the amount of the photo-polymerization initiator increases, the barrier rib is thickened.

It is also preferable that the photosensitive paste contains an ultraviolet ray absorber. By adding an ultraviolet ray absorber, a barrier rib having a high aspect ratio, a high definition and a high resolution can be obtained. The ultraviolet ray absorber is a compound having a high ultraviolet ray absorption effect. The ultraviolet ray absorber is preferably an organic dye, and particularly an organic dye having a high UV absorption coefficient in a wavelength range of 350 to 450 nm is preferably used. Specifically, azo-based dyes, aminoketone-based dyes, xanthene-based dyes, quinoline-based dyes, aminoketone-based dyes, anthraquinone-based dyes, benzophenone-based dyes, diphenylcyanoacrylate-based dyes, triazine-based dyes, p-aminobenzoic acid-based dyes and the like can be used. The organic-based dye does not remain in the barrier rib after firing, and is therefore preferable. Among them, azo-based and benzophenone-based dyes are preferable. The amount of the ultraviolet ray absorber is not limited, but is preferably in a range of 0.1 to 60% by mass, more preferably 0.1 to 30% by mass with respect to the photosensitive component. The relationship between the amount of the ultraviolet ray absorber and the shape of the barrier rib obtained also depends on an absorption wavelength of the ultraviolet ray absorber. For example, in the case of an ultraviolet ray absorber having a high UV absorption coefficient in a range of 350 to 450 nm, Lt/Lh easily decreases and Lb/Lh easily increases if the amount of the ultraviolet ray absorber is large. Conversely, if the amount of the ultraviolet ray absorber is small, Lt/Lh easily increases and Lb/Lh easily decreases.

The photosensitive paste may contain as a binder a copolymer having a carboxyl group. The copolymer having a carboxyl group is obtained by, for example, selecting a carboxyl group-containing monomer such as acrylic acid, methacrylic acid, itaconic acid, crotonic acid, maleic acid, fumaric acid, vinylacetic acid or an acid anhydride thereof and other monomers such as a methacrylic acid ester, an acrylic acid ester, styrene, acrylonitrile, vinyl acetate or 2-hydroxy acrylate, and copolymerizing the monomers using an initiator such as azobisisobutyronitrile. As the copolymer having a carboxyl group, a copolymer having an acrylic acid ester or a methacrylic acid ester and an acrylic acid or a methacrylic acid as copolymerization components is preferably used because the thermal decomposition temperature during firing is low.

The photosensitive paste is a paste excellent in solubility in an alkali aqueous solution when it contains a copolymer having a carboxyl group. The acid value of the copolymer having a carboxyl group is preferably 50 to 150 mg KOH/g. When the acid value is 150 mg KOH/g or less, the allowable range of development can be widened. When the acid value is 50 mg KOH/g or more, solubility of an unexposed part in a developer is not reduced. Therefore, it is not necessary to increase the concentration of a developer, and peeling of an exposed part is prevented, so that a high-definition pattern can be obtained. Further, it is also preferable that the copolymer having a carboxyl group has an ethylenically unsaturated group on a side chain. Examples of the ethylenically unsaturated group include an acryl group, a methacryl group, a vinyl group and an allyl group.

The photosensitive paste is prepared by adding an organic solvent and a binder as required to a low-melting-point glass and a photosensitive organic component containing a photosensitive monomer, a photosensitive oligomer, a photosensitive polymer, a photo-polymerization initiator or the like, and compounding various components so as to achieve a predetermined composition, followed by uniformly mixing and dispersing the mixture using a three-roll roller or a kneader.

The viscosity of the photosensitive paste can be appropriately adjusted by the added ratios of an inorganic powder, a thickener, an organic solvent, a polymerization inhibitor, a plasticizer, a precipitation preventive agent and so on, and is preferably in a range of 2 to 200 Pa·s. For example, when the photosensitive paste is applied to the substrate by a spin coating method, a viscosity of 2 to 5 Pa·s is preferable. When the photosensitive paste is applied to the substrate by a screen printing method to achieve a film thickness of 10 to 20 μm in one application, a viscosity of 50 to 200 Pa·s is preferable. When a blade coater method, a die coater method or the like is used, a viscosity of 10 to 50 Pa·s is preferable.

By applying the photosensitive paste thus obtained onto the substrate, forming a desired pattern by a photolithography method and performing firing, a barrier rib can be formed. An example of manufacturing a barrier rib by the photolithography method using the above-described photosensitive paste will be described, but the present invention is not limited thereto.

The photosensitive paste is applied onto the whole or part of the substrate surface to form a photosensitive paste coating film. As an application method, a screen printing method, or a method using a bar coater, a roll coater, a die coater, or subsequently a blade coater, or the like can be used. The coating thickness can be adjusted by selecting the number of applications, a mesh of the screen, and a viscosity of the paste.

Subsequently, an exposure step is performed. As the exposure step, generally exposure is performed through a photomask as in usual photolithography. Alternatively, a method of directly making a drawing by laser light, etc. without using a photomask may be used. As an exposure device, a proximity exposure machine or the like can be used. When exposure of a large area is performed, a large area can be exposed with an exposure machine having a small exposure area by performing exposure while carrying out conveyance after applying the photosensitive paste onto the substrate. Examples of the active light ray used at this time include a near infrared ray, a visible light ray and an ultraviolet ray. Among them, the ultraviolet ray is most preferable, and as a light source thereof, for example, a low-pressure mercury lamp, a high-pressure mercury lamp, an ultra-high pressure mercury lamp, a halogen lamp, a germicidal lamp or the like can be used, but the ultra-high pressure mercury lamp is preferred. Exposure conditions vary depending on a thickness of the photosensitive paste coating film, and usually exposure is preferably performed for 0.01 to 30 minutes using an ultra-high pressure mercury lamp with a power of 1 to 100 mW/cm$^2$. Lt, Lh and Lb can be appropriately changed by selecting optimum exposure conditions according to an exposure machine and materials to be used. If the exposure amount is decreased, Lt/Lh easily increases and Lb/Lh easily decreases. Conversely, if the exposure amount is increased, Lt/Lh easily decreases and Lb/Lh easily increases.

After exposure, development is performed using a difference in solubility in a developer between an exposed part and an unexposed part of the photosensitive paste coating film, thereby obtaining a desired grid-shaped photosensitive paste coating film pattern. Development is performed using a dipping method, a spray method or a brush method. For the developer, a solvent capable of dissolving the organic component in the paste can be used. Preferably the developer is mainly composed of water. When a compound having an acidic group such as a carboxyl group exists in the paste, development can be performed with an alkali aqueous solution. As the alkali aqueous solution, an inorganic alkali aqueous solution such as that of sodium hydroxide, sodium carbonate or calcium hydroxide can be used, but use of an organic alkali aqueous solution is more preferable because an alkali component is easily removed during firing. Examples of the organic alkali include tetramethylammonium hydroxide, trimethylbenzylammonium hydroxide, monoethanolamine and diethanolamine. The concentration of the alkali aqueous solution is preferably 0.05 to 5% by mass, more preferably 0.1 to 1% by mass. If the alkali concentration is excessively low, a soluble part may not be removed, and if the alkali concentration is excessively high, a pattern part may be peeled and a non-soluble part may be corroded. The development temperature during development is preferably 20 to 50° C. in terms of process control.

Next, a firing step is performed in a firing furnace. The atmosphere and temperature for the firing step vary depending on the types of the photosensitive paste and the substrate, but firing is performed in air or in an atmosphere of nitrogen, hydrogen or the like. As the firing furnace, a batch-type firing furnace or a belt-type continuous firing furnace can be used. Preferably firing is performed by keeping normally at the temperature of 500 to 700° C. for 10 to 60 minutes. The firing temperature is more preferably 500 to 650° C. The firing temperature being lower than 500° C. is not preferable because sintering of the barrier rib pattern does not proceed, and the strength of the barrier rib obtained decreases. The firing temperature being higher than 650° C. is not preferable because the bottom of the pattern is thickened due to softening of the barrier rib glass, so that Lb/Lh easily becomes greater than 3. By the step described above, the organic component is removed from the grid-shaped photosensitive paste coating film pattern, and the low-melting-point glass contained in the coating film pattern is softened and sintered to obtain a barrier rib member in which a grid-like barrier rib substantially composed of an inorganic substance is formed on a substrate.

For preventing leakage of light from the barrier rib, it is preferable that a reflecting film is formed on a surface of the barrier rib and a substrate surface which is not provided with the barrier rib. The material of the reflecting film is not particularly limited, but use of a material which is pervious to X-rays and reflects visible light, an electromagnetic wave of 300 to 800 nm emitted by the phosphor, is preferable. Particularly, a metal such as Ag, Au, Al, Ni or Ti or a metal oxide, which is less degradable is preferable. In the present invention, the surface of the barrier rib refers to a surface of the barrier rib except for a surface where the barrier rib and the substrate are not in contact with each other, i.e. the top of the barrier rib and the side surface of the barrier rib.

Formation of the reflecting film after formation of the barrier rib is preferable because reflecting films having the same material can be simultaneously formed on the surface of the barrier rib and the substrate surface which is not provided with the barrier rib. As a result, reflecting films having similar reflectivities can be formed on the side surface of the barrier rib and the substrate surface, so that visible light emitted by the phosphor can be uniformly guided to the sensor side more efficiently. It is preferable that a reflecting film is not formed on the substrate surface before formation of the barrier rib. In other words, it is preferable that a reflecting film is not formed on the surface where the barrier rib and the substrate are in contact with each other. This is because in the step of exposing the barrier rib, exposure light is scattered by the reflecting film, so that a high-definition pattern cannot be formed.

The method for forming a reflecting film is not particularly limited, and various kinds of film formation methods can be used such as a method in which a reflecting material is made pasty, applied to the surface, and then fired to remove a solvent, and a method in which a reflecting material is injected by a spray. Particularly, a vacuum film formation method such as vacuum deposition, sputtering, ion plating, CVD or laser ablation is preferable because a uniform reflecting film can be formed at a lower temperature, and sputtering is more preferable because a uniform film can be formed on the side surface of the barrier rib. If a temperature higher than the firing temperature of the barrier rib is applied during formation of the reflecting film, the barrier rib is deformed, and therefore the temperature during formation of the reflecting film is preferably lower than the temperature during formation of the barrier rib.

Next, a phosphor is filled in cells divided by the barrier rib, whereby a scintillator panel can be completed. Here, the cell refers to a space divided by a grid-like barrier rib. The phosphor filled in the cell is referred to as a scintillator layer.

For the phosphor, various known phosphor materials can be used. Particularly, a material having a high conversion rate of an X-ray to visible light, such as CsI, $Gd_2O_2S$, $Lu_2O_2S$, $Y_2O_2S$, $LaCl_3$, $LaBr_3$, $LaI_3$, $CeBr_3$, $CeI_3$, $LuSiO_5$ or $Ba(Br, F, Zn)$, is used, but the phosphor is not limited thereto. For enhancing luminous efficiency, various kinds of activators may be added. For example, in the case of CsI, a mixture of CsI and sodium iodide (NaI) in an arbitrary molar ratio, or CsI containing activation substances such as indium (In), thallium (Tl), lithium (Li), potassium (K), rubidium (Rb) or sodium (Na) is preferable. Further, a thallium compound such as thallium bromide (TlBr) thallium chloride (TlCl) or thallium fluoride (TlF, $TlF_3$) can also be used as an activator.

For formation of a scintillator layer, for example, a method in which crystalline CsI is deposited by vacuum deposition (in this case, it is also possible to co-deposit a thallium compound such as thallium bromide); a method in which a slurry of a phosphor dispersed in water is applied to a substrate; or a method in which a phosphor paste prepared by mixing a phosphor powder, an organic binder such as ethyl cellulose or an acrylic resin, and an organic solvent such as terpineol or γ-butyrolactone is applied using screen printing or a dispenser, can be used.

The amount of the phosphor filled in cells divided by the barrier rib is preferably 50% to 100% in terms of a volume fraction of the phosphor. The volume fraction of the phosphor in cells is referred to as a phosphor filling ratio. If the phosphor filling ratio is less than 50%, efficiency with which incident X-rays are converted to visible light is low. For enhancing conversion efficiency of incident X-rays, efficiency of conversion into visible light can be enhanced by increasing the aspect ratio of the barrier rib height to the barrier rib pitch, but it is preferable to fill the phosphor in the space of the cell with a high density because efficiency can be further enhanced.

For preventing reflectance and transmission of light, it is preferable to form a light shielding film between the barrier rib and the reflecting film. The material of the light shielding film is not particularly limited, and a metal film of chromium, nichrome, tantalum or the like, a resin containing a black pigment such as carbon, or the like can be used. The method for forming a light shielding film is not particularly limited, and a method including applying a pasty material, or various kinds of vacuum film formation methods can be used.

EXAMPLES

The present invention will be described in detail below by way of Examples. However, the present invention is not limited thereto.

(Raw Materials of Barrier Rib Photosensitive Paste)

Raw materials used for the barrier rib photosensitive paste of Examples are as follows.
Photosensitive monomer: trimethylolpropane triacrylate
Photosensitive polymer: product of addition reaction of 0.4 equivalents of glycidyl methacrylate to carboxyl groups of a copolymer of methacrylic acid/methyl methacrylate/styrene in a mass ratio of 40/40/30 (weight average molecular weight: 43000, acid value: 100)
Photo-polymerization initiator: 2-benzyl-2-dimethylamino-1-(4-morpholinophenyl)butanone-1 ("IC369" manufactured by BASF)
Ultraviolet ray absorber solution: 0.3 mass % γ-butyrolactone solution of Sudan IV (manufactured by TOKYO OHKA KOGYO Co., Ltd.)
Binder polymer: ethyl cellulose (manufactured by Hercules Inc.)
Polymerization inhibitor: 1,6-hexanediol-bis[(3,5-di-t-butyl-4-hydroxyphenyl)propionate])
Viscosity modifier: Flownon EC121 (manufactured by KYOEISHA CHEMICAL CO., LTD.)
Organic solvent: γ-butyrolactone
Low-melting-point glass powder A:
27% by mass of $SiO_2$, 31% by mass of $B_2O_3$, 6% by mass of ZnO, 7% by mass of $Li_2O$, 2% by mass of MgO, 2% by mass of CaO, 2% by mass of BaO, 23% by mass of $Al_2O_3$, refractive index (ng): 1.560, glass softening temperature: 588° C., thermal expansion coefficient: $70 \times 10^{-7}$, average particle diameter: 2.3 μm
Low-melting-point glass powder B:
28% by mass of $SiO_2$, 30% by mass of $B_2O_3$, 6% by mass of ZnO, 2% by mass of $Li_2O$, 3% by mass of MgO, 3% by mass of CaO, 3% by mass of BaO, 25% by mass of $Al_2O_3$, refractive index (ng): 1.551, glass softening temperature: 649° C., thermal expansion coefficient: $49 \times 10^{-7}$, average particle diameter: 2.1 μm
Low-melting-point glass powder C:
30% by mass of $SiO_2$, 34% by mass of $B_2O_3$, 4% by mass of ZnO, 1% by mass of $Li_2O$, 1% by mass of MgO, 2% by mass of CaO, 3% by mass of BaO, 26% by mass of $Al_2O_3$, refractive index (ng): 1.542, glass softening temperature: 721° C., thermal expansion coefficient: $38 \times 10^{-7}$, average particle diameter: 2.0 μm
Low-melting-point glass powder D:
22% by mass of $SiO_2$, 30% by mass of $B_2O_3$, 1% by mass of ZnO, 8% by mass of $Li_2O$, 10% by mass of $Na_2O$, 6% by mass of $K_2O$, 4% by mass of MgO, 11% by mass of BaO, 8% by mass of $Al_2O_3$, refractive index (ng): 1.589, glass softening temperature: 520° C., thermal expansion coefficient: $89 \times 10^{-7}$, average particle diameter: 2.4 μm
High-melting-point glass powder E:
30% by mass of $SiO_2$, 31% by mass of $B_2O_3$, 6% by mass of ZnO, 2% by mass of MgO, 2% by mass of CaO, 2% by mass of BaO, 27% by mass of $Al_2O_3$, refractive index (ng): 1.55, softening temperature: 790° C., thermal expansion coefficient: $32 \times 10^{-7}$, average particle diameter: 2.3 μm Example 1

An organic solution having the composition shown in Table 1 was prepared. The compositions shown in Table 1 are all based on parts by mass. 10 parts by mass of a photosensitive monomer, 24 parts by mass of a photosensitive polymer, 6 parts by mass of a photo-polymerization initiator, 0.2 part by mass of a polymerization inhibitor and 12.8 parts by mass of an ultraviolet ray absorber solution were dissolved in 38 parts by mass of an organic solvent under heating at a temperature of 80° C. After the obtained solution was cooled, 9 parts by mass of a viscosity modifier was added to prepare an organic solution 1. The refractive index (ng) of an organic coating film obtained by applying the organic solution 1 to a glass substrate and drying the applied solution was 1.553.

Next, to 60 parts by mass of the organic solution 1 were added 50 parts by mass of the low-melting-point glass powder A and 10 parts by mass of the high-melting-point glass powder E, followed by kneading the mixture by a three-roll kneader to prepare a barrier rib photosensitive paste A.

The barrier rib photosensitive paste A was applied to a glass substrate of 500 mm×500 mm ("OA-10" manufactured by NIPPON ELECTRIC GLASS Co., Ltd.) by a die coater so as to have a dry thickness of 580 µm, and dried to form a barrier rib photosensitive paste coating film. Next, the barrier rib photosensitive paste coating film was exposed at 700 mJ/cm$^2$ by an ultra-high pressure mercury lamp through a photomask (chrome mask) having a grid-like opening corresponding to a barrier rib pattern and having pitch of 160 µm. The exposed barrier rib photosensitive paste coating film was developed in a 0.5% aqueous ethanolamine solution, so that an unexposed part was removed to form a grid-like photosensitive paste coating film pattern. Further, the photosensitive paste coating film pattern was fired in air at 585° C. for 15 minutes to remove organic components and soften and sinter the low-melting-point glass, thereby obtaining a grid-like barrier rib.

Thereafter, an oxysulfide gadolinium having a particle diameter of 5 µm was mixed with ethyl cellulose, and the mixture was then filled in cells divided by the grid-like barrier rib, and was fired at 450° C. to form a scintillator layer having a phosphor filling ratio of 90%, thereby preparing a scintillator panel 1.

The shape of the cross section of the formed barrier rib was observed with a scanning electron microscope. In the case of a shape as shown in FIG. 1, 2, 3 or 5, Lt, Lh and Lb were calculated. When it was difficult to measure Lt or Lb as in FIG. 2 or 6, L90 in place of Lt or L10 in place of Lb was measured. Measurement results are shown in Table 4, The shape of the cross section perpendicular to the longitudinal direction in the barrier rib of Example 1 was similar to that in FIG. 3.

The obtained scintillator panel 1 was evaluated for (1) peeling or breakage of the barrier rib and (2) coating uniformity of the phosphor. Evaluation results are shown in Table 4. A sample free from defects for all the evaluation items was rated good. In Example 1, good results were obtained with the barrier rib and phosphor being free from defects.

Next, a photoelectric conversion element including a PIN type photodiode and a TFT and having a pixel size of 160 µm×160 µm was disposed on a glass substrate in a matrix form, and a wiring portion including a bias wiring for applying a bias to the PIN type photodiode, a driving wiring for applying a driving signal to the TFT, a signal wiring for outputting a signal charge transferred by the TFT, and so on was formed to prepare an output substrate. The output substrate and the scintillator panel 1 were bonded to each other with a adhesive, which contained a hot melt resin and had a thickness of 10 µm, interposed therebetween so that the photoelectric converter and the scintillator layer faced each other, thereby completing an X-ray detector.

For the prepared X-ray detector, X-rays at a tube voltage of 80 kVp were applied from the substrate side of the scintillator panel to photograph a solid image, and the photograph was observed to evaluate light emitting characteristics. Evaluation results are shown in Table 4. A sample free from image defects such as crosstalk or pixel defects, and luminance reduction or unevenness was rated good. In Example 1, images, which were free from image defects and had a high luminance and a high definition, were obtained.

Example 2

A scintillator panel and an X-ray detector were prepared by performing the same operations as in Example 1 except that the composition of the organic solution in the step of producing a barrier rib photosensitive paste was changed as shown in Table 1, and the exposure amount in the exposure step was changed to 1000 mJ/cm$^2$. The prepared scintillator panel and X-ray detector were evaluated in the same manner as in Example 1. Evaluation results are shown in Table 4.

Example 3

A scintillator panel and an X-ray detector were prepared by performing the same operations as in Example 1 except that the composition of the organic solution in the step of producing a barrier rib photosensitive paste was changed as shown in Table 1, and the exposure amount in the exposure step was changed to 1000 mJ/cm$^2$. The prepared scintillator panel and X-ray detector were evaluated in the same manner as in Example 1. Evaluation results are shown in Table 4.

Example 4

A scintillator panel and an X-ray detector were prepared by performing the same operations as in Example 1 except that the composition of the organic solution in the step of producing a barrier rib photosensitive paste was changed as shown in Table 1, the dry thickness of the barrier rib photosensitive paste coating film was changed to 350 µm, the exposure amount in the exposure step was changed to 630 mJ/cm$^2$, and the pitch of the photomask and the photoelectric conversion element was 80 µm. The prepared scintillator panel and X-ray detector were evaluated in the same manner as in Example 1. Evaluation results are shown in Table 4.

Example 5

A scintillator panel and an X-ray detector were prepared by performing the same operations as in Example 4 except that the composition of the organic solution in the step of producing a barrier rib photosensitive paste was changed as shown in Table 1, the exposure amount in the exposure step was changed to 900 mJ/cm$^2$, and the barrier rib firing temperature was changed to 595° C. The prepared scintillator panel and X-ray detector were evaluated in the same manner as in Example 1. Evaluation results are shown in Table 4.

Example 6

A scintillator panel and an X-ray detector were prepared by performing the same operations as in Example 4 except that the composition of the organic solution in the step of producing a barrier rib photosensitive paste was changed as shown in Table 1, the exposure amount in the exposure step was changed to 520 mJ/cm$^2$, and the barrier rib firing temperature was changed to 595° C. The prepared scintillator panel and X-ray detector were evaluated in the same manner as in Example 1. Evaluation results are shown in Table 4.

Example 7

A scintillator panel and an X-ray detector were prepared by performing the same operations as in Example 1 except that the composition of the organic solution in the step of producing a barrier rib photosensitive paste was changed as shown in Table 1, the dry film thickness of the barrier rib photosensitive paste coating film was changed to 1000 µm, the exposure amount in the exposure step was changed to 1100 mJ/cm², and the pitch of the photomask and the photoelectric conversion element was changed to 210 μm. The prepared scintillator panel and X-ray detector were evaluated in the same manner as in Example 1. Evaluation results are shown in Table 4.

Example 8

A scintillator panel and an X-ray detector were prepared by performing the same operations as in Example 7 except that the composition of the organic solution in the step of producing a barrier rib photosensitive paste was changed as shown in Table 1, and the exposure amount in the exposure step was changed to 900 mJ/cm². The prepared scintillator panel and X-ray detector were evaluated in the same manner as in Example 1. Evaluation results are shown in Table 4.

that the composition of the organic solution in the step of producing a barrier rib photosensitive paste was changed as shown in Table 2, the low-melting-point glass powder A was changed to the low-melting-point glass powder B, the dry film thickness of the barrier rib photosensitive paste coating film was changed to 630 μm, the exposure amount in the exposure step was changed to 850 mJ/cm², and the barrier rib firing temperature was changed to 650° C. The prepared scintillator panel and X-ray detector were evaluated in the same manner as in Example 1. Evaluation results are shown in Table 5.

Example 13

A scintillator panel and an X-ray detector were prepared by performing the same operations as in Example 1 except

TABLE 1

| | Example 1 | Example 2 | Example 3 | Example 4 | Example 5 | Example 6 | Example 7 | Example 8 |
|---|---|---|---|---|---|---|---|---|
| Photosensitive monomer | 10 | 10 | 10 | 10 | 10 | 10 | 10 | 10 |
| Photosensitive polymer | 24 | 24 | 24 | 24 | 24 | 24 | 24 | 24 |
| Photopolymerization initiator | 6 | 3 | 1.5 | 6 | 6 | 6 | 6 | 3 |
| Ultraviolet ray absorber solution | 12.8 | 6.4 | 9.6 | 9.6 | 9.6 | 9.6 | 12.8 | 6.4 |
| Organic solvent | 38 | 38 | 38 | 38 | 38 | 38 | 38 | 38 |
| Polymerization inhibitor | 0.2 | 0.2 | 0.2 | 0.2 | 0.2 | 0.2 | 0.2 | 0.2 |
| Viscosity modifier | 9 | 9 | 9 | 9 | 9 | 9 | 9 | 9 |

Example 9

A scintillator panel and an X-ray detector were prepared by performing the same operations as in Example 7 except that the composition of the organic solution in the step of producing a barrier rib photosensitive paste was changed as shown in Table 2, and the exposure amount in the exposure step was changed to 920 mJ/cm². The prepared scintillator panel and X-ray detector were evaluated in the same manner as in Example 1. Evaluation results are shown in Table 5.

Example 10

A scintillator panel and an X-ray detector were prepared by performing the same operations as in Example 1 except that the composition of the organic solution in the step of producing a barrier rib photosensitive paste was changed as shown in Table 2, and the exposure amount in the exposure step was changed to 1100 mJ/cm². The prepared scintillator panel and X-ray detector were evaluated in the same manner as in Example 1. Evaluation results are shown in Table 5.

Example 11

A scintillator panel and an X-ray detector were prepared by performing the same operations as in Example 1 except that the composition of the organic solution in the step of producing a barrier rib photosensitive paste was changed as shown in Table 2, and the exposure amount in the exposure step was changed to 1000 mJ/cm². The prepared scintillator panel and X-ray detector were evaluated in the same manner as in Example 1. Evaluation results are shown in Table 5.

Example 12

A scintillator panel and an X-ray detector were prepared by performing the same operations as in Example 1 except that the composition of the organic solution in the step of producing a barrier rib photosensitive paste was changed as shown in Table 2, the low-melting-point glass powder A was changed to the low-melting-point glass powder B, the dry film thickness of the barrier rib photosensitive paste coating film was changed to 255 μm, the exposure amount in the exposure step was changed to 690 mJ/cm², and the barrier rib firing temperature was changed to 650° C. The prepared scintillator panel and X-ray detector were evaluated in the same manner as in Example 1. Evaluation results are shown in Table 5.

Example 14

A scintillator panel and an X-ray detector were prepared by performing the same operations as in Example 1 except that the composition of the organic solution in the step of producing a barrier rib photosensitive paste was changed as shown in Table 2, the low-melting-point glass powder A was changed to the low-melting-point glass powder B, the dry film thickness of the barrier rib photosensitive paste coating film was changed to 360 μm, the exposure amount in the exposure step was changed to 550 mJ/cm², the barrier rib firing temperature was changed to 635° C., and the pitch of the photomask and the photoelectric conversion element was changed to 80 μm. The prepared scintillator panel and X-ray detector were evaluated in the same manner as in Example 1. Evaluation results are shown in Table 5.

Example 15

A scintillator panel and an X-ray detector were prepared by performing the same operations as in Example 1 except that the composition of the organic solution in the step of producing a barrier rib photosensitive paste was changed as shown in Table 2, the low-melting-point glass powder A was changed to the low-melting-point glass powder B, the exposure amount in the exposure step was changed to 900 mJ/cm$^2$, the barrier rib firing temperature was changed to 635° C., and the pitch of the photomask and the photoelectric conversion element was changed to 80 μm. The prepared scintillator panel and X-ray detector were evaluated in the same manner as in Example 1. Evaluation results are shown in Table 5.

that the composition of the organic solution in the step of producing a barrier rib photosensitive paste was changed as shown in Table 3, the dry film thickness of the barrier rib photosensitive paste coating film was changed to 1000 μm, the exposure amount in the exposure step was changed to 2000 mJ/cm$^2$, and the pitch of the photomask and the photoelectric conversion element was changed to 210 μm. The prepared scintillator panel and X-ray detector were

TABLE 2

|  | Example 9 | Example 10 | Example 11 | Example 12 | Example 13 | Example 14 | Example 15 |
|---|---|---|---|---|---|---|---|
| Photosensitive monomer | 10 | 20 | 8 | 10 | 10 | 10 | 10 |
| Photosensitive polymer | 24 | 24 | 24 | 23 | 23 | 23 | 23 |
| Photopolymerization initiator | 1.5 | 1.5 | 1.5 | 6 | 6 | 6 | 6 |
| Ultraviolet ray absorber solution | 9.6 | 9.6 | 9.6 | 12.8 | 12.8 | 9.6 | 9.6 |
| Organic solvent | 38 | 38 | 38 | 39 | 39 | 39 | 39 |
| Polymerization inhibitor | 0.2 | 0.2 | 0.2 | 0.2 | 0.2 | 0.2 | 0.2 |
| Viscosity modifier | 9 | 9 | 9 | 9 | 9 | 9 | 9 |

Comparative Example 1

A barrier rib was prepared by performing the same operations as in Example 1 except that the composition of the organic solution in the step of producing a barrier rib photosensitive paste was changed as shown in Table 3, and the low-melting-point glass powder A was changed to the low-melting-point glass powder C. The prepared barrier rib was evaluated in the same manner as in the case of the scintillator panel 1. Evaluation results are shown in Table 6. When the refractive index of the low-melting-point glass as a raw material of the barrier rib photosensitive paste is low, exposure light does not reach the bottom of the barrier rib. Accordingly, the shape of the cross section perpendicular to the longitudinal direction in the barrier rib of Comparative Example 1 was similar to that in the schematic view of FIG. 5, so that a large number of peelings, breakages and torsions occurred in the barrier rib.

Comparative Example 2

A scintillator panel and an X-ray detector were prepared by performing the same operations as in Example 1 except that the composition of the organic solution in the step of producing a barrier rib photosensitive paste was changed as shown in Table 3, the low-melting-point glass powder A was changed to the low-melting-point glass powder C, the exposure amount in the exposure step was changed to 1000 mJ/cm$^2$, and the barrier rib firing temperature was changed to 650° C. The prepared scintillator panel and X-ray detector were evaluated in the same manner as in Example 1. Evaluation results are shown in Table 6. Exposure light reached the bottom of the barrier rib, but the shape of the cross section perpendicular to the longitudinal direction in the barrier rib of Comparative Example 2 was similar to that in the schematic view of FIG. 6, so that a large number of breakages of the barrier rib and protrusions with the phosphor flowing out from cells occurred. For light emitting characteristics, luminance unevenness and considerable luminance reduction occurred.

Comparative Example 3

A scintillator panel and an X-ray detector were prepared by performing the same operations as in Example 1 except evaluated in the same manner as in Example 1. Evaluation results are shown in Table 6. The bottom of the barrier rib was significantly thick, and considerable luminance reduction occurred.

Comparative Example 4

A scintillator panel and an X-ray detector were prepared by performing the same operations as in Example 1 except that the composition of the organic solution in the step of producing a barrier rib photosensitive paste was changed as shown in Table 3, the low-melting-point glass powder A was changed to the low-melting-point glass powder D, and the firing temperature was changed to 530° C. The prepared scintillator panel and X-ray detector were evaluated in the same manner as in Example 1. Evaluation results are shown in Table 6. The height of the barrier rib was low, the bottom of the barrier rib was significantly thick, and considerable luminance reduction occurred due to coating failure of the phosphor.

TABLE 3

|  | Comparative Example 1 | Comparative Example 2 | Comparative Example 3 | Comparative Example 4 |
|---|---|---|---|---|
| Photosensitive monomer | 10 | 10 | 10 | 10 |
| Photosensitive polymer | 24 | 24 | 24 | 24 |
| Photopolymerization initiator | 6 | 3 | 6 | 6 |
| Ultraviolet ray absorber solution | 12.8 | 6.4 | 3.2 | 12.8 |
| Organic solvent | 38 | 38 | 38 | 38 |
| Polymerization inhibitor | 0.2 | 0.2 | 0.2 | 0.2 |
| Viscosity modifier | 9 | 9 | 9 | 9 |

Comparative Example 5

50 parts by mass of a terpineol solution containing 10% by mass of ethyl cellulose and 50 parts by mass of the low-melting-point glass powder A were mixed to prepare a screen printing paste. The refractive index (ng) of an organic coating film obtained by applying a terpineol solution, which contained 10% by mass of ethyl cellulose, to a glass substrate and drying the applied solution was 1.49. The printing paste was repeatedly applied in a film thickness of 40 μm by screen printing and dried for 12 layers using a pattern having pitches of 160 μm in longitudinal and traverse directions, an opening length of 125 μm×125 μm, a wall width of 35 μm and a size appropriate to a predetermined number of pixels. Thereafter, firing was performed in air at 550° C. to prepare a barrier rib. Thereafter, a scintillator panel and an X-ray detector were prepared by performing the operations as in Example 1. The prepared scintillator panel and X-ray detector were evaluated in the same manner as in Example 1. Evaluation results are shown in Table 6. A large number of torsions of the barrier rib and coating failures of the phosphor occurred.

TABLE 4

Figure 3:
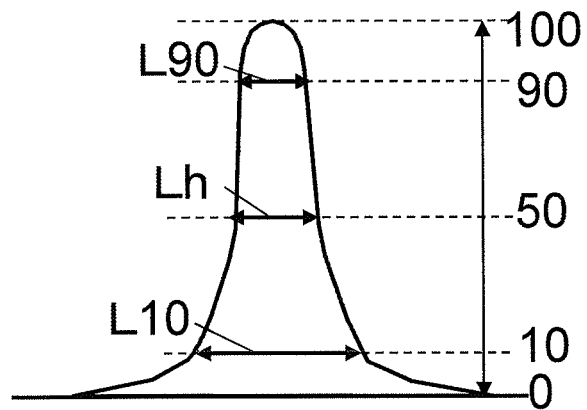
FIG. 3 is a schematic view showing a cross section perpendicular to the longitudinal direction in a barrier rib of a third aspect in the present invention.

|  | Example 1 | Example 2* | Example 3* | Example 4 | Example 5 | Example 6 | Example 7 | Example 8 |
|---|---|---|---|---|---|---|---|---|
| Similar cross section shape | FIG. 3 | FIG. 2 | FIG. 2 | FIG. 1 | FIG. 4 | FIG. 4 | FIG. 3 | FIG. 3 |
| Lt [μm] | 25 | 21 | 25 | 15 | 22 | 5 | 32 | 35 |
| Lh [μm] | 27 | 25 | 30 | 20 | 24 | 9 | 32 | 42 |
| Lb [μm] | 38 | 39 | 43 | 22 | 42 | 26 | 46 | 55 |
| Lt/Lh | 0.93 | 0.84 | 0.83 | 0.75 | 0.92 | 0.56 | 1 | 0.83 |
| Lb/Lh | 1.41 | 1.56 | 1.43 | 1.1 | 1.75 | 2.89 | 1.44 | 1.31 |
| R [μm] | — | — | — | — | 14 | 9 | — | — |
| H [μm] | 400 | 350 | 410 | 250 | 220 | 230 | 700 | 710 |
| P [μm] | 160 | 160 | 160 | 80 | 80 | 80 | 210 | 210 |
| Barrier rib defects | Good | Good | Good | Good | Good | Good | Good | Good |
| Phosphor defects | Good | Good | Good | Good | Good | Good | Good | Good |
| Light emitting characteristics | Good | Good | Good | Good | Good | Good | Good | Good |

*L90 in place of Lt and L10 in place of Lb is shown.

TABLE 5

|  | Example 9 | Example 10 | Example 11 | Example 12* | Example 13* | Example 14 | Example 15* |
|---|---|---|---|---|---|---|---|
| Similar cross section shape | FIG. 3 | FIG. 1 | FIG. 3 | FIG. 2 | FIG. 2 | FIG. 1 | FIG. 2 |
| Lt [μm] | 38 | 27 | 13 | 28 | 12 | 4 | 22 |
| Lh [μm] | 45 | 32 | 29 | 32 | 15 | 7 | 30 |
| Lb [μm] | 61 | 50 | 45 | 66 | 33 | 10 | 56 |
| Lt/Lh | 0.84 | 0.84 | 0.45 | 0.88 | 0.8 | 0.57 | 0.73 |
| Lb/Lh | 1.36 | 1.56 | 1.55 | 2.06 | 2.2 | 1.43 | 1.87 |
| R [μm] | — | — | — | — | — | — | — |
| H [μm] | 720 | 430 | 400 | 500 | 200 | 250 | 450 |
| P [μm] | 210 | 160 | 160 | 160 | 160 | 80 | 80 |
| Barrier rib defects | Good | Good | Good | Good | Good | Good | Good |
| Phosphor defects | Good | Good | Good | Good | Good | Good | Good |
| Light emitting characteristics | Good | Good | Good | Good | Good | Good | Good |

*L90 in place of Lt and L10 in place of Lb is shown.

TABLE 6

Figure 5:
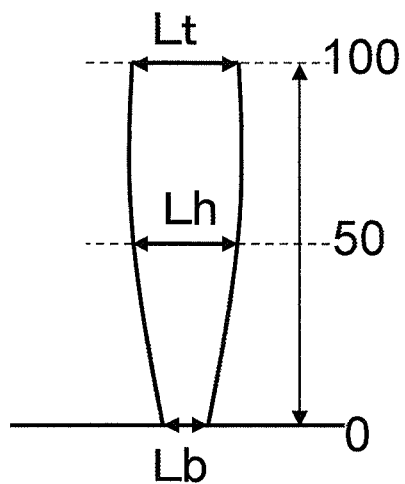
FIG. 5 is a schematic view showing a cross section perpendicular to the longitudinal direction in a barrier rib that is not encompassed by the present invention.
Figure 6:
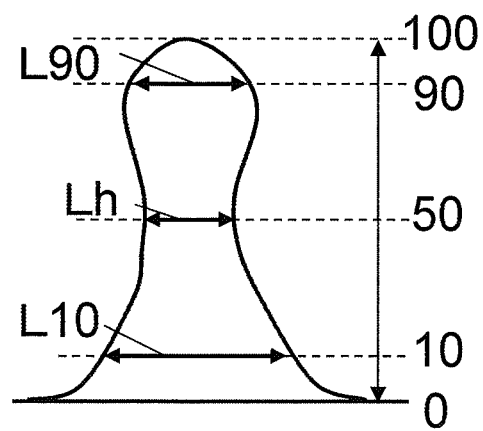
FIG. 6 is a schematic view showing a cross section perpendicular to the longitudinal direction in a barrier rib that is not encompassed by the present invention.

|  | Comparative Example 1 | Comparative Example 2* | Comparative Example 3 | Comparative Example 4* | Comparative Example 5 |
|---|---|---|---|---|---|
| Similar cross section shape | FIG. 5 | FIG. 6 | FIG. 3 | FIG. 2 | — |
| Lt [μm] | 30 | 59 | 42 | 12 | 38 |
| Lh [μm] | 27 | 43 | 43 | 32 | 36 |
| Lb [μm] | 25 | 72 | 134 | 120 | 39 |
| Lt/Lh | 1.11 | 1.37 | 0.98 | 0.38 | 1.06 |
| Lb/Lh | 0.93 | 1.67 | 3.12 | 3.75 | 1.08 |
| R [μm] | — | — | — | — | — |
| H [μm] | 400 | 400 | 700 | 350 | 400 |
| P [μm] | 160 | 160 | 210 | 160 | 160 |
| Barrier rib defects | large number of breakages | Breakage | Good | Good | Torsion |
| Phosphor defects | Coating impossible | Coating unevenness | Good | Coating failure | Coating failure |
| Light emitting characteristics | — | Luminance unevenness and reduction | Luminance reduction | Luminance reduction | Luminance reduction |

*L90 in place of Lt and L10 in place of Lb is shown.

From the above evaluation results, it is apparent that the scintillator panel of the present invention is provided with a barrier rib, which has high luminous efficiency and is free from distortion and the like, in a large area and with high accuracy, and can provide sharp images having reduced image unevenness and linear noises.

DESCRIPTION OF REFERENCE SIGNS

1 Radiation detector
2 Scintillator panel
3 Output substrate
4 Substrate
5 Buffer layer
6 Barrier rib
7 Scintillator layer
8 Diaphragm layer
9 Photoelectric conversion layer
10 Output layer
11 Substrate
12 Power supply portion
13 Reflecting film The present invention can be suitably used as a scintillator panel which constitutes a radiation detector that is used for a medical diagnostic apparatus, a nondestructive inspection instrument and the like.

The invention claimed is:

1. A scintillator panel comprising: a plate-like substrate; a barrier rib provided on the substrate; and a scintillator layer comprising a phosphor filled in cells divided by the barrier rib, wherein
the barrier rib is formed of a material which is mainly composed of a low-melting-point glass containing 2 to 20% by mass of an alkali metal oxide,
a value obtained by dividing a top width Lt of the barrier rib or a 90%-height width L90 of the barrier rib by a half-value width Lh of the barrier rib is 0.45 to 1, and
a value obtained by dividing a bottom width Lb of the barrier rib or a 10%-height width L10 of the barrier rib by the half-value width Lh is 1 to 3,
wherein the pitch P of the barrier rib is 120 to 240 μm, the half-value width Lh is 10 to 40 μm, and the height H of the barrier rib is 200 to 800 μm.

2. The scintillator panel according to claim 1, wherein the half-value width Lh is 10 to 30 μm, and the height H of the barrier rib is 200 to 500 μm.

3. The scintillator panel according to claim 1, wherein a line that connects the end of the central portion of the barrier rib to the end of the bottom surface of the barrier rib at a cross section perpendicular to the longitudinal direction in the barrier rib is a curved line.

4. The scintillator panel according to claim 1, wherein a reflecting film is formed on a surface of the barrier rib.

5. A method for manufacturing the scintillator panel according to any one of claim 1, 2, 3, or 4, the method comprising:
forming a photosensitive paste coating film by applying onto a substrate a photosensitive paste which contains a low-melting-point glass and a photosensitive organic component;
exposing the obtained photosensitive paste coating film to light in a predetermined pattern;
dissolving and removing a part of the exposed photosensitive paste coating film which is soluble in a developer;
heating the photosensitive paste coating film pattern after development to a firing temperature of 500° C. to 700° C. to remove the organic component and soften and sinter the low-melting-point glass and thereby forming a barrier rib; and
filling a phosphor.

6. A scintillator panel comprising: a plate-like substrate; a barrier rib provided on the substrate; and a scintillator layer comprising a phosphor filled in cells divided by the barrier rib, wherein
the barrier rib is formed of a material which is mainly composed of a low-melting-point glass containing 2 to 20% by mass of an alkali metal oxide,
a value obtained by dividing a top width Lt of the barrier rib or a 90%-height width L90 of the barrier rib by a half-value width Lh of the barrier rib is 0.45 to 1, and
a value obtained by dividing a bottom width Lb of the barrier rib or a 10%-height width L10 of the barrier rib by the half-value width Lh is 1 to 3,
wherein the height H of the barrier rib is 200 to 800 μm.

* * * * *